US006703927B2

(12) United States Patent  (10) Patent No.: US 6,703,927 B2
Kan  (45) Date of Patent: Mar. 9, 2004

(54) HIGH FREQUENCY REGENERATIVE DIRECT DETECTOR

(75) Inventor: Iu Peng Kan, Kowloon (HK)

(73) Assignee: K Jet Company Ltd., Kowloon (HK)

( * ) Notice: Subject to any disclaimer, the term of this patent is extended or adjusted under 35 U.S.C. 154(b) by 18 days.

(21) Appl. No.: 10/052,330

(22) Filed: Jan. 18, 2002

(65) Prior Publication Data

US 2003/0139158 A1 Jul. 24, 2003

(51) Int. Cl.[7] .............................................. B60R 25/10
(52) U.S. Cl. ...................................... 340/426; 340/500
(58) Field of Search ................................ 340/426, 428, 340/511, 518, 825, 870.19; 307/10.2, 10.6; 348/500, 674, 101

(56) References Cited

U.S. PATENT DOCUMENTS 3,836,706 A  *  9/1974  Keegan et al. ............... 348/500
5,900,806 A  *  5/1999  Issa et al. .................... 340/426

* cited by examiner

Primary Examiner—Rajnikant B. Patel
(74) Attorney, Agent, or Firm—Raymond Y. Chan; David and Raymond Patent Group

(57) ABSTRACT

A high frequency super regenerative direct detector includes a power supply and a signal detecting circuit arrangement electrically connected thereto. The signal detecting circuit arrangement, which is a transistor control system, includes a high frequency by-pass circuit, a LC tank circuit configured to be tuned at a pre-tuned frequency to receive an incoming signal to generate an oscillator frequency, ranging from 850 MHz to 960 MHz, a quenching circuit generating a quenching frequency, and a transistor circuit device configured to incorporate oscillator frequency into the quenching frequency in such a manner that when the incoming signal matches the pre-tuned frequency, a timing to achieve a saturated level of the quenching frequency is faster than no signal period, and a modulation frequency of the incoming signal is detected out from the signal detecting circuit arrangement.

20 Claims, 5 Drawing Sheets

HIGH FREQUENCY REGENERATIVE DIRECT DETECTOR

BACKGROUND OF THE PRESENT INVENTION

1. Field of Invention

The present invention relates to communication signal detecting circuit, and more particularly to a high frequency regenerative direct detector, which can not only reduce radio interference to provide a better voice clarity but also exempt the limitation of Federal Communication Commission (FCC), so as to provide a longer remote control distance for the radio frequency (RF) consumer products and devices while being cost effectively.

2. Description of Related Arts

Nowadays, radio frequency has been widely in use for enhancing the mobility of a product. By simply employing a receiver and a transmitter, a user is able to remote control the product from a predetermined distance. The distinctive feature of the radio frequency is that when a higher radio frequency is used, a longer remote control distance can be obtained. Therefore, a high end product such as a cellular phone must be utilized at least 900 MHz in order to receive the signal from the transmitter to the receiver within a long remote control distance. Also, for the low end product such as home appliance or alarm system, a lower radio frequency may be utilized.

It is ideal that every single product utilizes a higher radio frequency so that the user is able to remote control the product more precisely in a distant manner. However, to utilize higher radio frequency in a product has several drawbacks generally. FIG. 1 illustrates a partial schematic circuit diagram for a 900 MHz cellular phone RF receiver that illustrates the complexity of such circuit. The Super-heterodyne circuit specifically incorporated with the cellular phone comprises a RF amplifier for amplify the incoming band signal such as 935 to 960 MHz, a local oscillator which frequency is tuned below the 900 MHz incoming signal frequency is injected into a mixer. The output of the mixer, intermediate frequency at 135 MHz, is amplified and inputted to an intermediate frequency processor chip. Even though the Super-heterodyne circuit provides a good performance, the circuit configuration for the receiver is relatively complicated and expensive.

As shown in FIG. 2, a circuit utilizing with 900 MHz radio frequency for an existing home use cordless phone is illustrated, wherein the circuit, which is another type of Super-heterodyne circuit, also must comprise the basic components, such as the RF amplifier, the local oscillator, the mixer, the IF amplifier, and the IF processor chip. Even through the circuit configuration for the cordless home phone is simple than the Super-heterodyne circuit of the cellular phone, the cost of the circuit is still expensive and complicated enough that the most common mid/low end products are not affordable.

In order to reduce the cost of the product, a lower radio frequency has to use. For example, the receiver and transmitter for an existing remote control toy car can only afford to utilize a radio frequency in a range from 27 to 49 MHz. However, the circuit efficiency is low and radio interference is high. Besides, the transmitter output power is limited ⅕ in comparison with the 900 MHz per FCC regulation. Hence, the remote control distance is short and a long exposed antenna is required due to the longer wavelength.

Another example illustrates that the circuit for an existing remote control alarm guard device utilizes a 300 MHz radio receiver. Since the transmitter output power is about ⅛ in comparison with the 900 MHz per FCC regulation, the remote control distance for the alarm guard device is relatively short. Furthermore, the continuous transmission from the transmitter to the receiver for supervision is not allowed per FCC regulation, which will substantially decrease the accuracy and the efficiency of remote control of the product.

SUMMARY OF THE PRESENT INVENTION

A main object of the present invention is to provide a high frequency regenerative direct detector, which can reduce radio interference to provide a better voice clarity, so as to provide a longer remote control distance for the radio frequency (RF) consumer products and devices while being cost effective.

Another object of the present invention is to provide a high frequency regenerative direct detector, which comprises a superior radio frequency (RF) transistor for directly detecting out the human being audible frequency, so as to simplify the circuit configuration of the present invention that significantly reduces the cost and pros ides a better performance.

Another object of the present invention is to provide a high frequency regenerative direct detector, which exempts the limitation of Federal Communication Commission (FCC) part 15 for radio frequency device above 70 MHz that continuous transmission is not allowed except 900 MHz band from 902 MHz to 928 MHz or some other band at 2.4 GHz and above.

Another object of the present invention is to provide a high frequency regenerative direct detector, wherein the receiver is employed with a radio frequency detection circuit for amplification, signal mixing and detection of designated incoming RF signal. The audio modulation frequency still be detected out directly through the circuitry. Once the modulation frequency signal is detected out, the user can use the audio band signal or codes (depending on the type of the transmitter) to conduct a desired output for the product such as voice communication, control motor movement or alarm triggering.

Another object of the present invention is to provide a high frequency regenerative direct detector, wherein no expensive or complicated circuit structure is required to employ in the present invention in order to achieve the above mentioned objects. Therefore, the present invention successfully provides an economic and efficient solution for providing a circuit configuration with a higher radio frequency for the mid/low end wireless products such as remote control security, walkie talkie or alarm guard system without using expensive and complicated Super-heterodyne circuit.

Accordingly, in order to accomplish the above objects, the present invention provides a high frequency regenerative direct detector, which comprises a power supply and a signal detecting circuit arrangement electrically connected thereto.

The signal detecting circuit arrangement, which is a transistor control system, comprises a high frequency by-pass circuit, a LC tank circuit configured to be tuned at a pre-tuned frequency to receive an incoming signal and to generate an oscillator frequency ranging from 850 MHz to 960 MHz, a quenching circuit generating a quenching frequency, and a transistor circuit device configured to incorporate the oscillator frequency into the quenching frequency in such a manner that when the incoming signal matches the pre-tuned frequency, a timing to achieve a saturated level of the quenching frequency is faster than no signal period, and a modulation frequency of the incoming signal is detected out from the signal detecting circuit arrangement.

DETAILED DESCRIPTION OF THE PREFERRED EMBODIMENT

Figure 1:
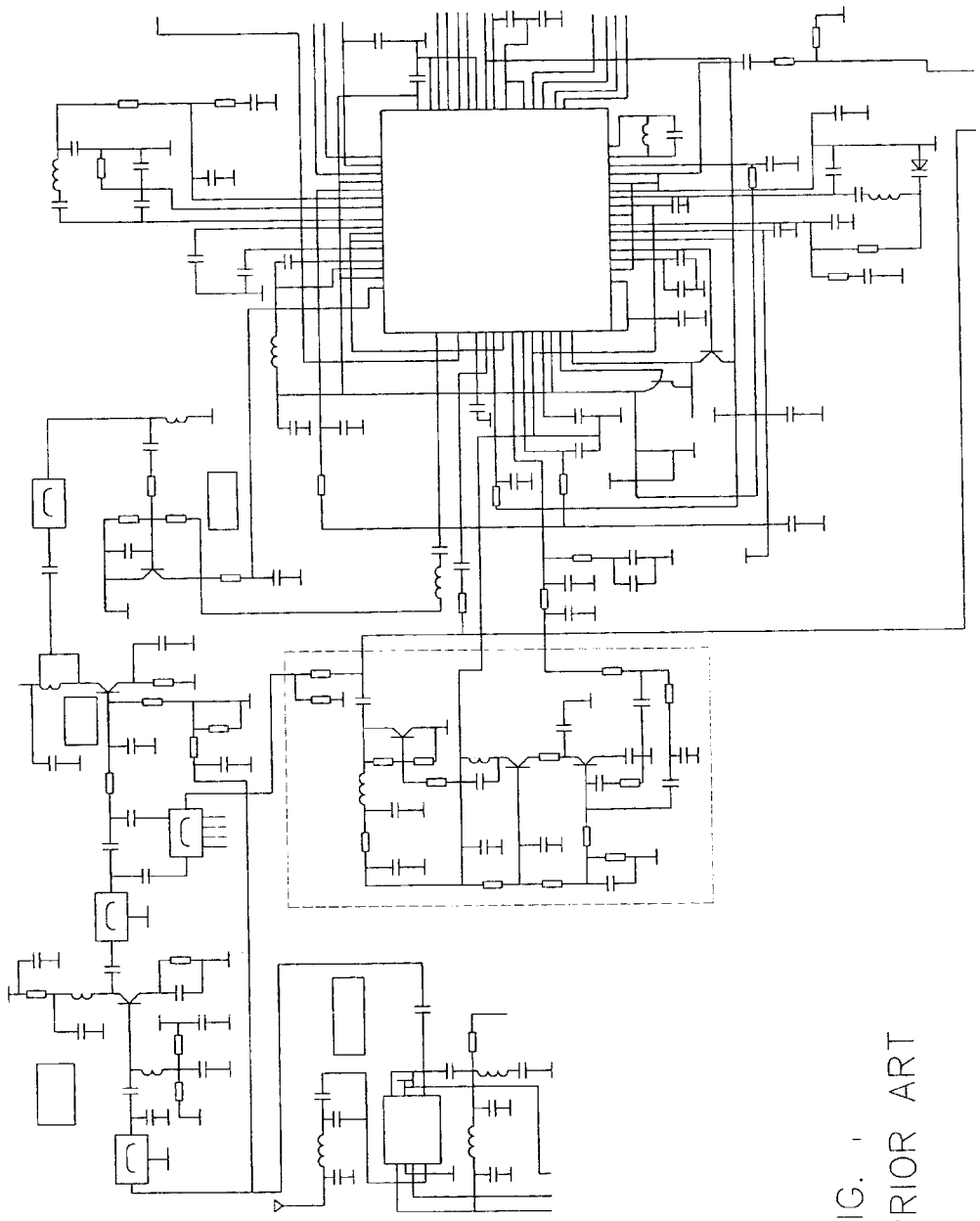
FIG. 1 illustrates a conventional circuit diagram for an existing cellular phone.
Figure 2:
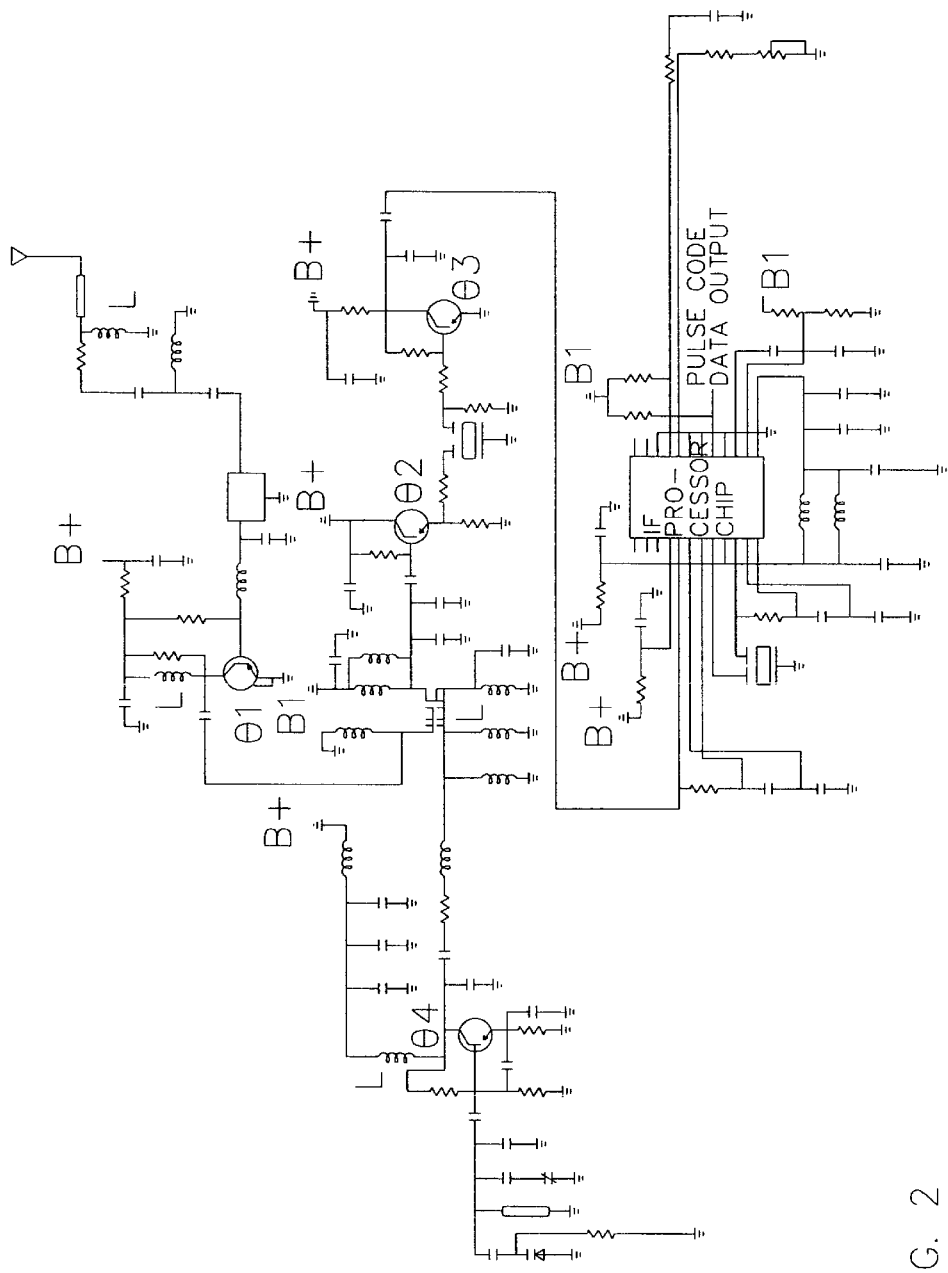
FIG. 2 illustrates another conventional circuit diagram for an existing wireless home phone.
Figure 3:
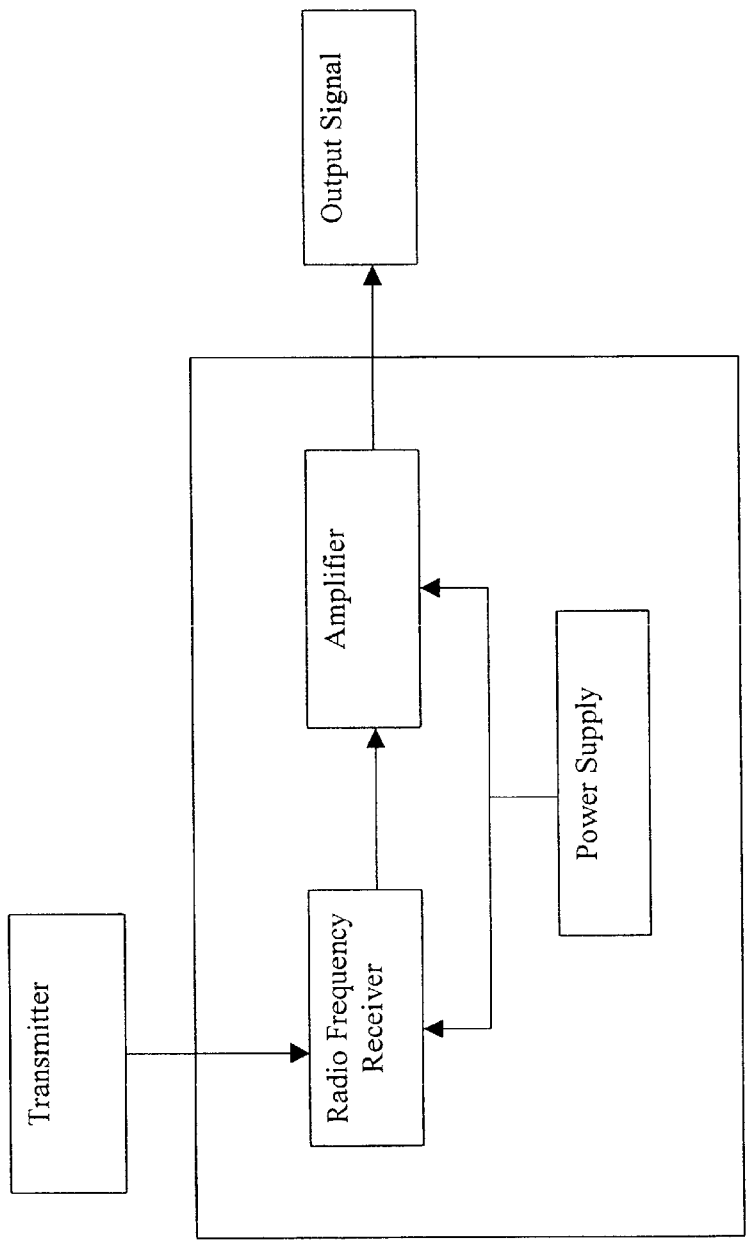
FIG. 3 is a block diagram of a high frequency super regenerative direct detector according to a preferred embodiment of the present invention.
Figure 4:
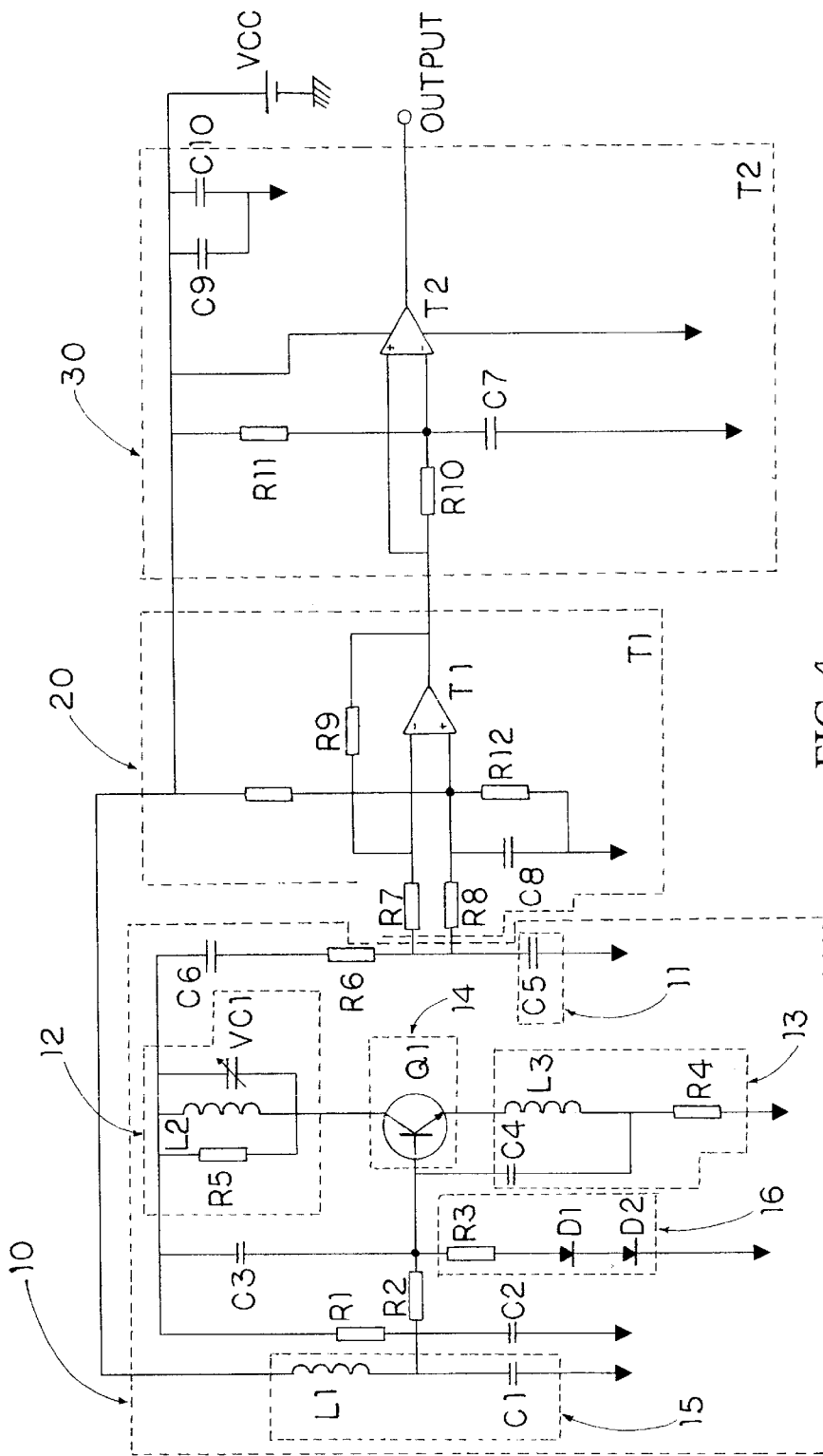
FIG. 4 is a circuit diagram of the high frequency super regenerative direct detector according to the above preferred embodiment of the present invention.

Referring to FIGS. 3 and 4 of the drawings, a high frequency regenerative direct detector according to a preferred embodiment of the present invention is illustrated. The high frequency regenerative direct detector comprises a power supply VCC and a signal detecting circuit arrangement 10 electrically connected with the power supply VCC.

The signal detecting circuit arrangement 10, which is a transistor control system, comprises a high frequency by-pass circuit 11, a LC tank circuit arrangement 12 configured to be tuned at a pre-tuned frequency to receive an incoming signal and to generate an oscillator frequency, ranging from 850 MHz to 960 MHz, preferably 900 MHz or above, a quenching circuit 13 generating a quenching frequency, and a transistor circuit device 14 configured to incorporate the oscillator frequency into the quenching frequency in such a manner that, when the incoming signal matches the pre-tuned frequency, a timing to achieve a saturated level of the quenching frequency is faster than no signal period, and a modulation frequency of the incoming signal is detected out from the signal detecting circuit arrangement 10.

According to the preferred embodiment, the signal detecting circuit arrangement 110 comprises six resistors R1–R6, six capacitors C1–C6, three coil inductors L1–L3, and a variable capacitor VC1 to configure a complete circuit.

The high frequency by-pass circuit 11 comprises a filter capacitor C5 which is a high frequency by-pass filter capacitor wherein the filter capacitor C5 is configured to by-pass the superimposed residual quenching frequency and high frequency noise on the incoming signal to ground.

The LC tank circuit 12 comprises the LC coil inductor L2 and the LC variable capacitor VC1 wherein a LC resistor R5 is electrically coupling with the LC tank circuit 12 in a parallel connection. The LC coil inductor L2 functions as an antenna to receive the incoming signal wherein the incoming signal must have a frequency at 900 MHz or above. The LC variable capacitor VC1 is tuned to the pre-tuned frequency at 900 MHz or above. The LC resistor R5 is configured to incorporate with the LC tank circuit 12 to provide a wider bandwidth of the oscillator frequency for reliable reception. It is worth to mention that a LC variable coil inductor is capable of substituting the LC variable capacitor VC1 in order to pre-tune the frequency at 900 MHz or above.

The quenching circuit 13 comprises the quenching coil inductor L3, the quenching capacitor C4 and the quenching resistor R4 electrically coupling together to generate the quenching frequency wherein the quenching frequency has a value usually below 2 MHz.

Accordingly, the transistor circuit device 14 comprises a transistor Q1 which is a super high frequency NPN transistor in the signal detecting circuit arrangement 10, wherein the transistor Q1 is used for radio frequency amplifier, mixer, and audio band signal detector against the incoming signal.

The signal detecting circuit 10 further comprises a filter circuit 15 and a stabilizer circuit 16. The filter circuit 15 comprises a first capacitor C1 and the first coil inductor L1 working works with the first capacitor C1 as a filter to suppress the high frequency leaking back to the power supply VCC.

The stabilizer circuit 16 comprises a stabilizer resistor R3 and a first and a second stabilizer diode D1, D2 to provide a stable self-bias to the base of the transistor circuit device 14 to obtain a stable operation of the quenching circuit 13 and the transistor circuit device 14. It is worth to mention that when the stabilizer circuit 16 contains only one stabilizer diode (one of the first and second stabilizer diodes D1, D2), the signal detecting circuit 10 is still workable but may have less effective.

A first resistor R1 is configured to provide a DC bias to a collector of the transistor circuit device 14 through the LC coil inductor L2. A second resistor R2 is configured to provide the DC bias to the base of the transistor circuit device 14.

A second capacitor C2 for decoupling purpose has a value more than a value of the first capacitor C1. A third capacitor C3 is configured to provide a feed back path from the oscillator frequency to the base of the transistor Q1 of the transistor circuit device 14 for reliable oscillation. A sixth capacitor C6 is configured to couple with a sixth resistor R6 so as to couple the incoming signal to an amplifier stage.

As shown in FIG. 4, the high frequency regenerative direct detector further comprises a signal amplifying circuit arrangement 20, which is the amplifier stage of the incoming signal and comprises an amplifying operation amplifier T1 for amplifying the modulation frequency with a predetermined ratio so as to tune the modulation frequency to a higher level audio output signal. Accordingly, the amplifying operation amplifier T1 is adapted to further amplify the weak audio band output signal and shape it out for a desired form.

The signal amplifying circuit arrangement 20 further comprises a first and a second amplifying resistor R7, R9 and a filtering capacitor C8 wherein the modulation frequency is inputted to the signal amplifying circuit arrangement 20 at the first amplifying resistor R7 and is amplified with a ratio. The ratio is calculated by dividing the third amplifying resistor R9 into the sum of the sixth resistor R6 and the first amplifying resistor R7, i.e. the ratio=(R9/(R6+R7)).

The high frequency regenerative direct detector further comprises an audio output circuit arrangement 30 coupling with the signal amplifying circuit arrangement 20 wherein the audio output circuit arrangement 30 comprises an output operation amplifier T2 working as a voltage comparator to perform a comparator level refinement so that the audio output signal outputted from the amplifying operation amplifier T1 of the signal amplifying circuit arrangement 20 is shaped to a pulse form at the output operation amplifier T2 for subsequent control circuit use such as CPU, coding logic control in different kinds of devices and consumer products such as alarm, security control, remote control or home appliance.

Figure 5:
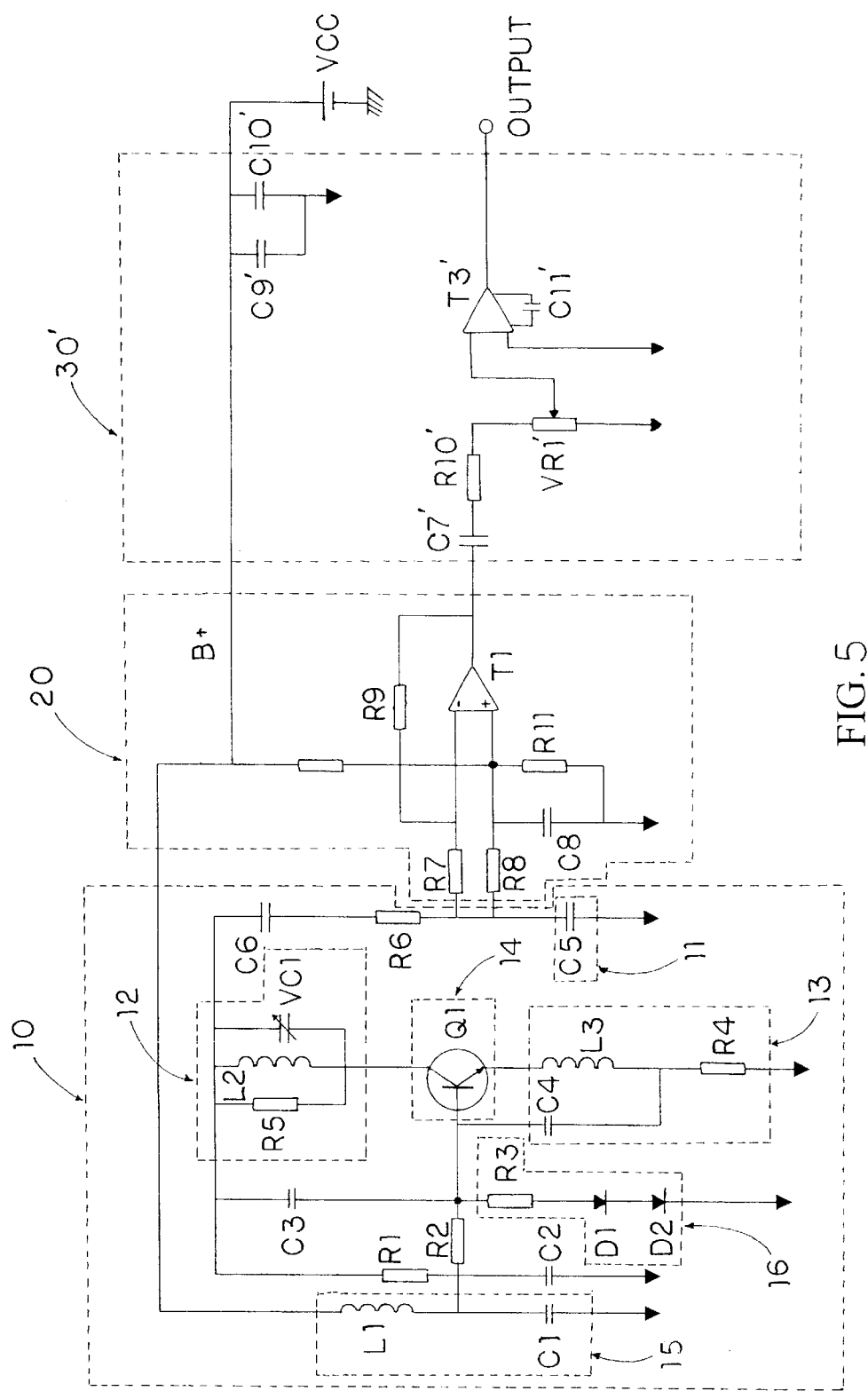
FIG. 5 illustrates an alternative mode of the audio output circuit arrangement of the 900 MHz super regenerative direct detector according to the above preferred embodiment of the present invention.

FIG. 5 illustrates an alternative mode of the audio output circuit arrangement 30' which is configured to have an input resistor R10', a volume control VR1', four capacitors C7', C9', C10', C11', and a power amplifier T3', wherein the audio output circuit arrangement 30' is arranged to amplify the audio output signal outputted from the amplifying operation amplifier T1 of the signal amplifying circuit arrangement 20 through the respective coupling capacitor C7', the input resistor R10', and the volume control VR1' by the power amplifier T3', so as to shape said audio output signal into a wave form. Therefore, an output signal of the power amplifier T3' is adapted for connecting to a speaker for voice receiver purpose. It is worth to mention that the high frequency super regenerative direct detector of the present invention as shown in FIG. 5 is designed for voice receiver purpose at the frequency 900 MHz or above.

In view of above, the high frequency regenerative direct detector of the present invention substantially achieves the following features:

(1) The present invention can reduce radio interference to provide a better voice clarity, so as to provide a longer remote control distance for the radio frequency (RF) consumer products and devices while being cost effective.

(2) By configuring a superior radio frequency (RF) transistor for directly detecting out the human being audible frequency, the present invention simplifies the circuit configuration of the present invention that significantly reduces the cost and provides a better performance.

(3) The present invention exempts the limitation of Federal Communication Commission (FCC) part 15 for radio frequency device above 70 MHz that continuous transmission is not allowed except 900 MHz band from 902 MHz to 928 MHz or some other hand at 2.4 GHz and above.

(4) The receiver of the present invention is employed with a radio frequency detection circuit for amplification, signal mixing and detection of designated incoming RF signal. The audio modulation frequency will be detected out directly through the circuitry. Once the modulation frequency signal is detected out, the user can use the audio band signal or codes (depending on the type of the transmitter) to conduct a desired output for the product such as voice communication, control motor movement or alarm triggering.

(5) No expensive or complicated circuit structure is required to employ in the present invention in order to achieve the above mentioned objects. Therefore, the present invention successfully provides an economic and efficient solution for providing a circuit configuration with a higher radio frequency for the mid/low end wireless products such as remote control, security, walkie-talkie or alarm guard system without using expensive and complicated Superheterodyne circuit.

What is claimed is:

1. A regenerative direct detector, comprising:
   a power supply; and
   a signal detecting circuit arrangement electrically connected with said power supply, wherein said signal detecting circuit arrangement comprises a high frequency by-pass circuit, a LC tank circuit configured to be tuned at a pre-tuned frequency to receive an incoming signal and to generate an oscillator frequency, from 850 MHz to 960 MHz, a quenching circuit generating a quenching frequency, and a transistor circuit device configured to incorporate said oscillator frequency into said quenching frequency in such a manner that when said incoming signal matches said pre-tuned frequency, a timing to achieve a saturated level of said quenching frequency is faster than no signal period, and a modulation frequency of said incoming signal is detected out from said signal detecting circuit arrangement.

2. A regenerative direct detector, as recited in claim 1, wherein said LC tank circuit comprises a LC coil inductor functioning as an antenna to receive said incoming signal and a LC variable capacitor tuned to said pre-tuned frequency at least 900 MHz, wherein a LC resistor is electrically coupling with said LC tank circuit and configured to provide a wider bandwidth of said oscillator frequency for reliable reception.

3. A regenerative direct detector, as recited in claim 1, wherein said quenching circuit comprises a quenching coil inductor, a quenching capacitor, and a quenching resistor electrically coupling together to generate said quenching frequency which has a value not more than 2 MHz.

4. A regenerative direct detector, as recited in claim 2, wherein said quenching circuit comprises a quenching coil inductor, a quenching capacitor, and a quenching resistor electrically coupling together to generate said quenching frequency which has a value not more than 2 MHz.

5. A regenerative direct detector, as recited in claim 2, wherein said transistor circuit device comprises a super high frequency NPN transistor configured for radio frequency amplifier, mixer, and audio band signal detector against said incoming signal.

6. A regenerative direct detector, as recited in claim 3, wherein said transistor circuit device comprises a super high frequency NPN transistor configured for radio frequency amplifier, mixer, and audio band signal detector against said incoming signal.

7. A regenerative direct detector, as recited in claim 4, wherein said transistor circuit device comprises a super high frequency NPN transistor configured for radio frequency amplifier, mixer, and audio band signal detector against said incoming signal.

8. A regenerative direct detector, as recited in claim 2, wherein said signal detecting circuit, which is a transistor control system, further comprises a stabilizer circuit comprising a stabilizer and at least a stabilizer diode to provide a stable self-bias to a bias of said transistor circuit device to obtain a stable operation of said quenching circuit and said transistor circuit device.

9. A regenerative direct detector, as recited in claim 4, wherein said signal detecting, circuit; which is a transistor control system, further comprises a stabilizer circuit comprising a stabilizer and at least a stabilizer diode to provide a stable self-bias to a bias of said transistor circuit device to obtain a stable operation of said quenching circuit and said transistor circuit device.

10. A regenerative direct detector, as recited in claim 7, wherein said signal detecting circuit, which is a transistor control system, further comprises a stabilizer circuit comprising a stabilizer and at least a stabilizer diode to provide a stable self-bias to a bias of said transistor circuit device to obtain a stable operation of said quenching circuit and said transistor circuit device.

11. A regenerative direct detector, as recited in claim 2, further comprising a signal amplifying circuit arrangement, which is an amplifier stage of said incoming signal, comprising an amplifying operation amplifier for amplifying said modulation frequency with a predetermined ratio so as to tune said modulation frequency to a higher level audio output signal.

12. A regenerative direct detector, as recited in claim 4, further comprising a signal amplifying circuit arrangement, which is an amplifier stage of said incoming signal, comprising an amplifying operation amplifier for amplifying said modulation frequency with a predetermined ratio so as to tune said modulation frequency to a higher level audio output signal.

13. A regenerative direct detector, as recited in claim 7, further comprising a signal amplifying circuit arrangement, which is an amplifier stage of said incoming signal, comprising an amplifying operation amplifier for amplifying said modulation frequency with a predetermined ratio so as to tune said modulation frequency to a higher level audio output signal.

14. A regenerative direct detector, as recited in claim 10, further comprising a signal amplifying circuit arrangement, which is an amplifier stage of said incoming signal, comprising an amplifying operation amplifier for amplifying said modulation frequency with a predetermined ratio so as to tune said modulation frequency to a higher level audio output signal.

15. A regenerative direct detector, as recited in claim 12, further comprising an audio output circuit arrangement coupling with said signal amplifying circuit arrangement wherein said audio output circuit arrangement comprises an output operation amplifier working as a voltage comparator and a refinement circuit to perform an comparator level refinement so that said audio output signal outputted from said amplifying operation amplifier of said signal amplifying circuit arrangement is shaped to a pulse form at said output operation amplifier.

16. A regenerative direct detector, as recited in claim 13, further comprising an audio output circuit arrangement coupling with said signal amplifying circuit arrangement wherein said audio output circuit arrangement comprises an output operation amplifier working as a voltage comparator and a refinement circuit to perform an comparator level refinement so that said audio output signal outputted from said amplifying operation amplifier of said signal amplifying circuit arrangement is shaped to a pulse form at said output operation amplifier.

17. A regenerative direct detector, as recited in claim 14, further comprising an audio output circuit arrangement coupling with said signal amplifying circuit arrangement wherein said audio output circuit arrangement comprises an output operation amplifier working as a voltage comparator and a refinement circuit to perform an comparator level refinement so that said audio output signal outputted from said amplifying operation amplifier of said signal amplifying circuit arrangement is shaped to a pulse form at said output operation amplifier.

18. A regenerative direct detector, as recited in claim 12, further comprising an audio output circuit arrangement coupling with said signal amplifying circuit arrangement wherein said audio output circuit arrangement comprises an output resistor, a volume control, at least an output capacitors, and a power amplifier, wherein said audio output circuit arrangement is arranged to amplify said audio output signal outputted from said amplifying operation amplifier of said signal amplifying circuit arrangement through said output capacitor, said output resistor, and said volume control by said power amplifier, so as to shape said audio output signal into a wave form.

19. A regenerative direct detector, as recited in claim 13, further comprising an audio output circuit arrangement coupling with said signal amplifying circuit arrangement wherein said audio output circuit arrangement comprises an output resistor, a volume control, at least an output capacitors, and a power amplifier, wherein said audio output circuit arrangement is arranged to amplify said audio output signal outputted from said amplifying operation amplifier of said signal amplifying circuit arrangement through said output capacitor, said output resistor, and said volume control by said power amplifier, so as to shape said audio output signal into a wave form.

20. A regenerative direct detector, as recited in claim 14, further comprising an audio output circuit arrangement coupling with said signal amplifying circuit arrangement wherein said audio output circuit arrangement comprises an output resistor, a volume control, at least an output capacitors, and a power amplifier, wherein said audio output circuit arrangement is arranged to amplify said audio output signal outputted from said amplifying operation amplifier of said signal amplifying circuit arrangement through said output capacitor, said output resistor, and said volume control by said power amplifier, so as to shape said audio output signal into a wave form.

* * * * *